United States Patent

Shimura

Patent Number: 5,231,040
Date of Patent: Jul. 27, 1993

[54] METHOD OF MAKING A FIELD EFFECT TRANSISTOR

[75] Inventor: Teruyuki Shimura, Itami, Japan

[73] Assignee: Mitsubishi Denki Kabushiki Kaisha, Tokyo, Japan

[21] Appl. No.: 825,293

[22] Filed: Jan. 23, 1992

Related U.S. Application Data

[62] Division of Ser. No. 446,981, Dec. 6, 1989, abandoned.

[30] Foreign Application Priority Data

Apr. 27, 1989 [JP] Japan ................ 1-108232

[51] Int. Cl.⁵ .......................... H01L 21/205
[52] U.S. Cl. .......................... 437/41; 437/44; 437/912; 437/944; 437/978; 148/DIG. 1
[58] Field of Search .......... 437/41, 44, 912, 944, 437/978; 148/DIG. 1

[56] References Cited

U.S. PATENT DOCUMENTS

| | | | |
|---|---|---|---|
| D.281,441 | 3/1990 | Kasai | 437/912 |
| D.370,428 | 5/1990 | Europe | 437/912 |
| 4,359,816 | 11/1982 | Abbas et al. | 437/41 |
| 4,472,872 | 9/1984 | Toyoda et al. | 437/41 |
| 4,735,913 | 4/1988 | Hayes | 357/22 |
| 4,774,555 | 9/1988 | Kohn et al. | 357/22 |
| 4,916,498 | 4/1990 | Berenz | 357/22 |

FOREIGN PATENT DOCUMENTS

| | | | |
|---|---|---|---|
| 0283278 | 9/1988 | European Pat. Off. | |
| 57-153430 | 9/1982 | Japan | 437/912 |
| 60-50967 | 3/1985 | Japan | |
| 59-15630 | 8/1985 | Japan | 357/22 |
| 61-73377 | 4/1986 | Japan | 437/912 |
| 61-78174 | 4/1986 | Japan | 357/22 |
| 63-23366 | 1/1988 | Japan | |
| 63-36577 | 2/1988 | Japan | |
| 63-228762 | 9/1988 | Japan | |

Primary Examiner—Olik Chaudhuri
Assistant Examiner—Long Pham
Attorney, Agent, or Firm—Leydig, Voit & Mayer

[57] ABSTRACT

A semiconductor device constituting a high electron mobility transistor or metal semiconductor field effect transistor includes an n⁺ type InGaAs layer at an upper surface of the device, a source and a drain electrode on the n⁺ type InGaAs layer, as non-alloying ohmic contacts, a gate electrode produced of the same metal as the source and drain electrodes, and the gate electrode and the source and drain electrodes are self-aligningly positioned and separated from each other by L-shaped insulating films.

9 Claims, 4 Drawing Sheets

METHOD OF MAKING A FIELD EFFECT TRANSISTOR

This application is a divisional of application Ser. No. 07/446,981, filed Dec. 6, 1989, now abandoned.

FIELD OF THE INVENTION

The present invention relates to a semiconductor device and a production method therefor and, more particularly to high electron mobility transistors (HEMT) and metal semiconductor field effect transistors (MESFET).

BACKGROUND OF THE INVENTION

FIGS. 2(a) to 2(d) are cross-sectional views showing process steps for producing a prior art semiconductor device. In FIG. 2, reference numeral 1 designates a semi-insulating GaAs substrate. An undoped GaAs layer 2 of about 5000 angstroms thickness is disposed on the substrate 1. A two dimensional electron gas 3 is disposed at an upper portion of the undoped GaAs layer 2, by an n type AlGaAs layer 4 having a film thickness of about 1000 angstroms and impurity concentration of about $3 \times 10^{17}$ cm$^{-3}$ disposed on the undoped GaAs layer 2. An n type GaAs layer 5 of about 2000 angstroms thickness and impurity concentration of about $3 \times 10^{18}$ cm$^{-3}$ is disposed on the n type AlGaAs layer 4. A source electrode 6 and a drain electrode 7 are disposed on the n type GaAs layer 5. Reference numeral 8 designates a drain electrode photoresist pattern and reference numeral 9 designates a gate electrode.

The device will operate as follows.

Electrons are supplied from the n type AlGaAs layer 4 to the undoped GaAs layer 2 and a two dimensional electron gas 3 is generated in the undoped GaAs layer 2. The movement of the electrons in the two-dimensional electron gas 3 is controlled by the gate electrode 9, and the current flowing between the drain electrode 6 and the source electrode 7 is thus controlled. Since the electrons in the two-dimensional electron gas 3 move in the undoped GaAs layer 2, they are not scattered by impurities. Therefore, an FET of quite low noise characteristics is obtained.

The production method will be described.

The structure shown in FIG. 2(a) is produced by molecular beam epitaxy (MBE) or metal organic chemical vapor deposition (MOCVD). Next, a source and a drain electrode 6 and 7 are produced thereon by vapor deposition and using the liftoff method. Then, a gate electrode photoresist pattern 8 is produced, and a recess is formed at the n type GaAs substrate 5 by wet etching using a sulfuric acid or tartaric acid etchant and photoresist pattern 8 as a mask. A gate electrode 9 is deposited at the recess by vapor deposition and the lift-off method, thereby completing a device.

Generally in a HEMT or MESFET semiconductor device, a narrow gate length is required for the enhancement of performance such as characteristics speed. In the prior art semiconductor device constructed in such a manner, however, the gate length is restricted by the size of the photoresist pattern, and it is difficult to miniaturize the gate. Furthermore, the increase in the gate resistance accompanying a narrow gate width has caused a problem.

Furthermore, in the HEMT or MESFET semiconductor device, parasitic capacitance and parasitic resistance must be reduced to enhance element performance.

It is especially, important to suppress the series resistance between the source and gate electrode. In the above-described prior art semiconductor device, however, since the gate electrode and the source/drain electrode are located far from each other, in order to reduce the source to gate series resistance, formation of etching a recess by the n type GaAs layer is required. Etching the recess has caused problems in the uniformity and reproducibility in the current value and the pinch-off voltage.

FIG. 3 shows another prior art GaAs MESFET disclosed in Japanese Published Patent Application 63-36577. In this GaAs MESFET, indium ions 40 are ion implanted into a GaAs semi-insulating substrate 41 on which an active layer 42 is deposited. Annealing is carried out to produce an In$_x$Ga$_{1-x}$As layer 43 whose energy band gap is gradually lower as is closer to the surface. Thereafter, a metal layer is produced thereon, thereby producing source/drain electrodes 44 providing ohmic contacts on the n$^+$ type InGaAs layers 43 without alloying.

In this prior art device, however, fine patterning of the gate is not attempted, and the gate electrode and the source/drain electrode are located far from each other, therefore, the source series resistance cannot be reduced.

FIG. 4 shows still another prior art GaAs MESFET disclosed in Japanese Published Patent Application 60-50967. In this GaAs MESFET, an n$^+$ type Ge thin layer 51 having the same function as the above-described n$^+$ type InGaAs layer, that is, providing non-alloying ohmic contact source/drain electrodes, is disposed on an active layer 52. The Ge layer 51 is selectively etched (over-etched in the transverse direction) from the gate aperture portion of the insulating film for space 53 which is disposed on the Ge layer 51, and a gate 54 is disposed on the exposed surface of the etched portion. Further, the insulating film for spacer 53 is formed by photolithography at both sides of the gate aperture, and source and drain electrodes 55 and 56 are produced thereon. Thus, the effective interval between the source and gate can be controlled, and further, the source, gate, and drain electrodes can be produced from the same material at the same time, thereby simplifying the production process.

In this prior art method, however, the fine patterning of the gate cannot be conducted without increasing the gate resistance. Furthermore, since the production of the source/drain electrodes is independently conducted by photolithography after the production of the gate aperture, the production of the source/drain electrodes is not self-aligning with the gate electrode, also producing an insufficient reduction of the source series resistance.

SUMMARY OF THE INVENTION

It is an object of the present invention to provide a semiconductor device with a miniaturized the gate without increasing the gate resistance and reducing the source series resistance without etching a recess in the n type GaAs layer.

Another object of the present invention is to provide a semiconductor device superior in uniformity and reproducibility.

Still another object of the present invention is to provide a method of producing such a semiconductor device.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a semiconductor device of the present invention, a T-shaped fine pattern gate is produced utilizing an L-shaped insulating film and a reversely L-shaped insulating film. Thus, the increase in the gate resistance is suppressed and the gate is narrow.

The gate electrode and the source/drain electrodes have a short distance therebetween, thereby reducing the source series resistance.

An $n^+$ type InGaAs layer is disposed on an upper surface of the device to produce non-alloying ohmic contact source and drain electrodes and a gate electrode comprising the same material as the source and drain electrodes, thereby enhancing the reliability of the device.

In addition, by selectively etching the $n^+$ type InGaAs, the source series resistance can be lowered without selectively etching n type GaAs, thereby producing a HEMT or MESFET device superior in uniformity and reproducibility of the current value and the pinch-off voltage.

DETAILED DESCRIPTION OF THE PREFERRED EMBODIMENTS

Figure 1A:
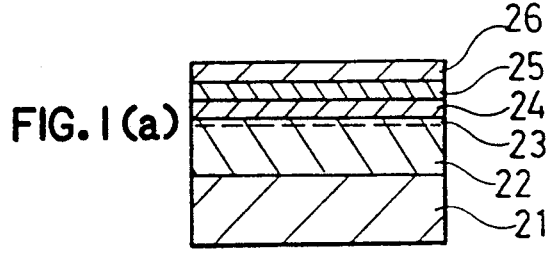
FIGS. 1(a) to 1(j) are diagrams illustrating a production method of a semiconductor device according to an embodiment of the present invention.

An embodiment of the present invention will be described in detail with reference to the drawings.

FIGS. 1(a) to 1(j) are cross-sectional views showing a production method of a HEMT according to an embodiment of the present invention. In FIG. 1, reference numeral 21 designates a semi-insulating GaAs substrate. An undoped GaAs layer 22 having a film thickness of about 5000 angstroms is disposed on the substrate 21. A two dimensional electron gas 23 is generated at an upper portion of the undoped GaAs layer 22 by an n type AlGaAs layer 24 having a film thickness of about 1000 angstroms and impurity concentration of about $3 \times 10^{17}$ cm$^{-3}$ disposed on the undoped GaAs layer 22. An n type GaAs layer 25 having a film thickness of about 0 to 500 angstroms and impurity concentration of about $3 \times 10^{18}$ cm$^{-3}$ is disposed on the n type AlGaAs layer 24. Reference numeral 27 designates a first insulating film comprising SiO having a thickness of about 2000 angstroms. Reference numeral 28 designates a photoresist pattern for processing the first insulating film 27. Reference numeral 29 designates a second insulating film comprising SiN having a film thickness of 1500 angstroms. Reference numeral 30 designates a side wall insulating film comprising SiO. Reference numeral 31 designates successive layers of metal of Ti/Mo/Au. Reference numeral 32 designates a gate electrode, reference numeral 33 designates a drain electrode, and reference numeral 34 designates a source electrode.

The production process will be described.

First of all, the structure shown in FIG. 1(a) is produced by molecular beam epitaxy or metal organic chemical vapor deposition.

Figure 1B:
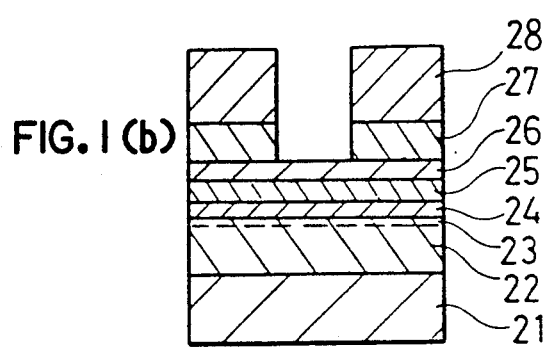

Next, as shown in FIG. 1(b), the first insulating film 27 comprising SiO is deposited on the entire surface of wafer to a thickness of about 2000 angstroms, and a photoresist pattern 28 is deposited thereon. The first insulating film 27 is etched by reactive ion etching (generally referred to as "RIE") using a gas mixture such as $C_2F_6+CHF_3+O_2+He$ using the photoresist pattern 28 as a mask, thereby producing a groove of width less than about 1 micron.

Figure 1C:
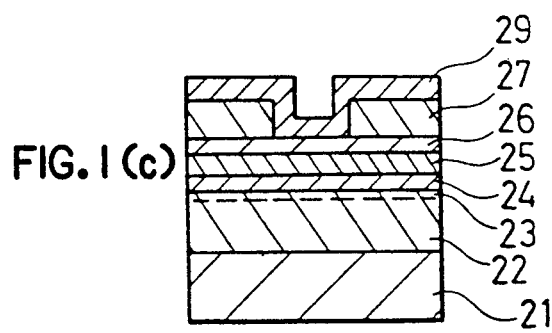

Next, as shown in FIG. 1(c), the photoresist 28 is removed and thereafter, a second insulating film 29 comprising SiN is deposited on the entire surface to a thickness of about 1500 angstroms.

Figure 1D:
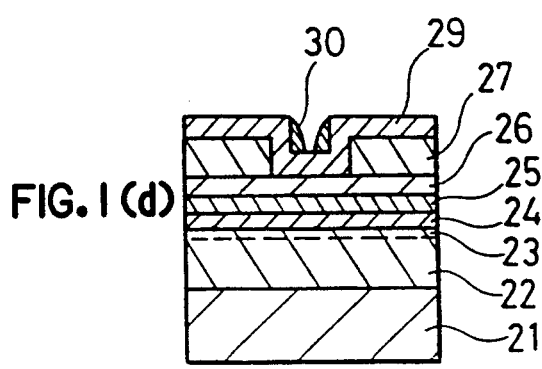

Next, as shown in FIG. 1(d), an insulating film comprising SiO is deposited on the entire surface and a portion thereof is etched method by an etching such as RIE using $C_2F_6+CHF_3+O_2+He$ gases, and a side wall 30 comprising the insulating film is produced at the side surface of the second kind of insulating film 29.

Figure 1E:
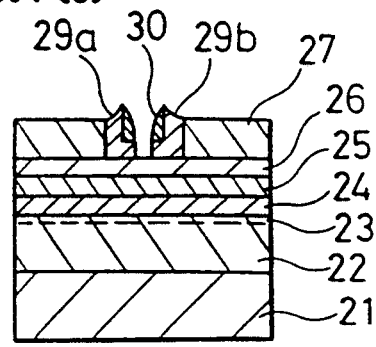

Next, as shown in FIG. 1(e), the second insulating film 29 on the first insulating film 27 is removed by an etching process such in RIE. Herein, as RIE, $CHF_3+O_2$ gas is used. Herein, the etching conditions (including substrate temperature and mixing ratio of the gases) that etch only the second insulating film 29 and do not etch the insulating films 27 and 30 are selected.

Figure 1F:
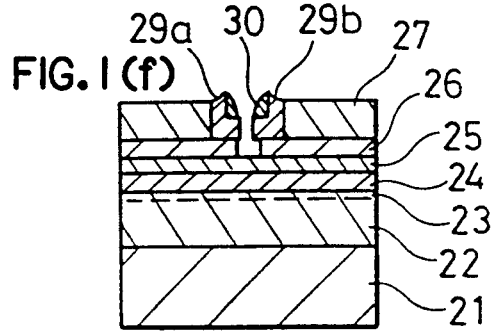

Next, as shown in FIG. 1(f), the $n^+$ type InGaAs layer 26 is selectively etched, while the n type GaAs layer 25 is not by an etching solution such as boiling concentrated HCl.

Figure 1G:
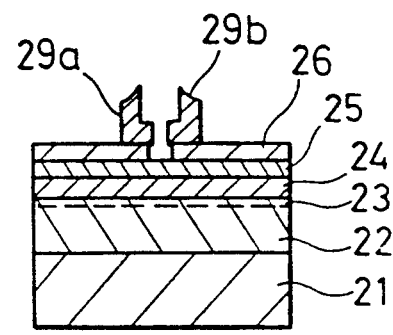

Next, as shown in FIG. 1(g), only the insulating films 27 and 30 comprising SiO are etched by RIE using a mixture of $C_2F_6+CHF_3+O_2+He$ gases, and L-shaped and reversely L-shaped insulating films 29a and 29b comprising the second insulating film are produced.

Figure 1H:
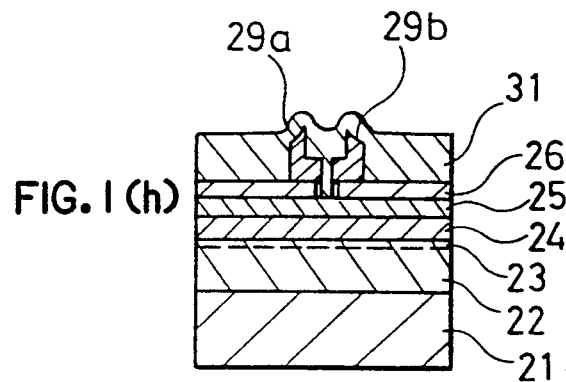
Figure 1I:
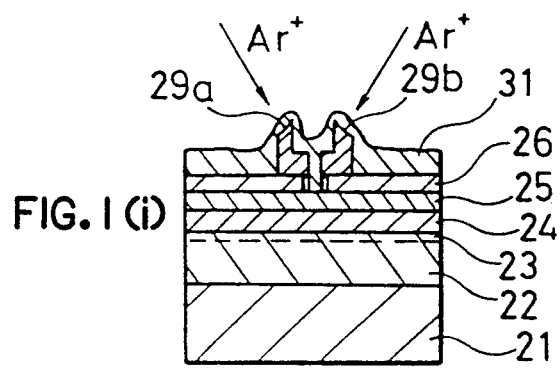
Figure 1J:
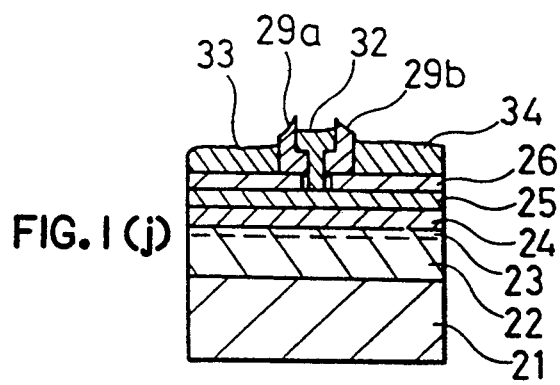
Figure 2A:
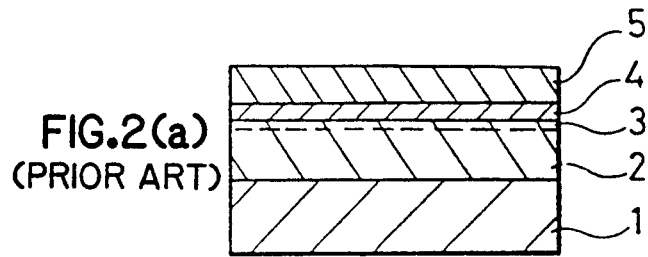
FIGS. 2(a) to 2(d) are diagrams illustrating a production method of a semiconductor device according to the prior art.
Figure 2B:
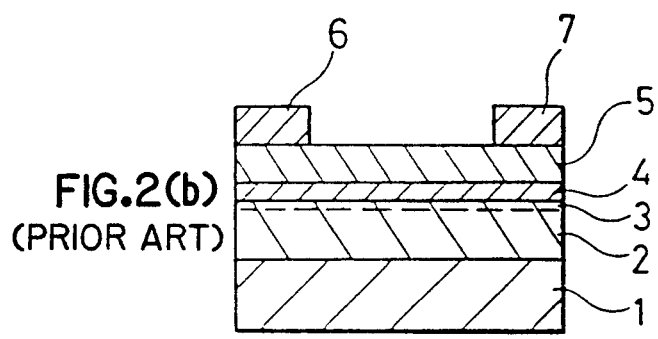
Figure 2C:
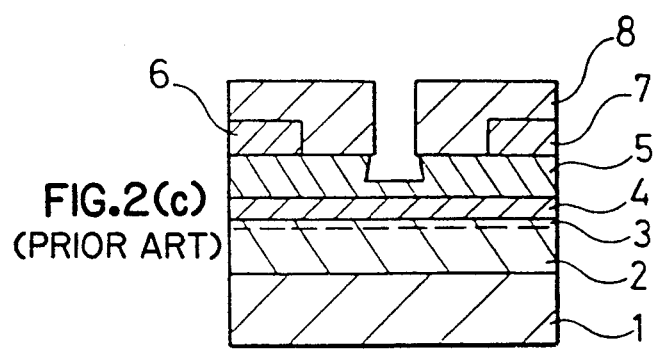
Figure 2D:
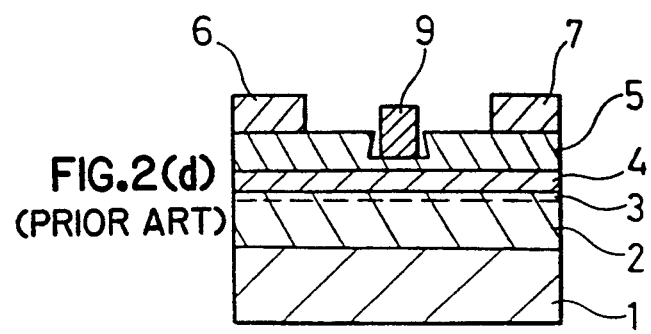
Figure 3A:
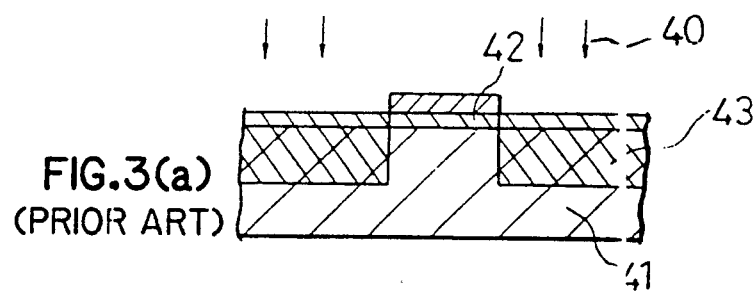
FIGS. 3(a) and 3(b) are diagrams illustrating a production method of a semiconductor device according to the prior art.
Figure 3B:
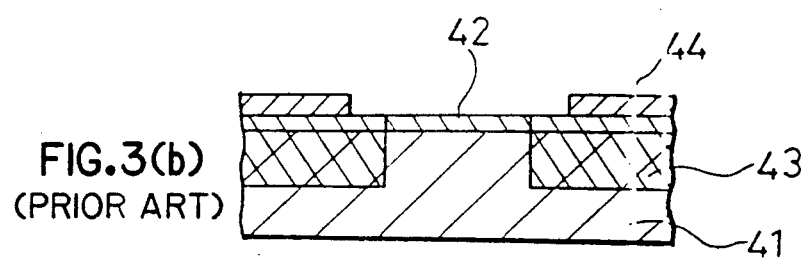
Figure 4A:
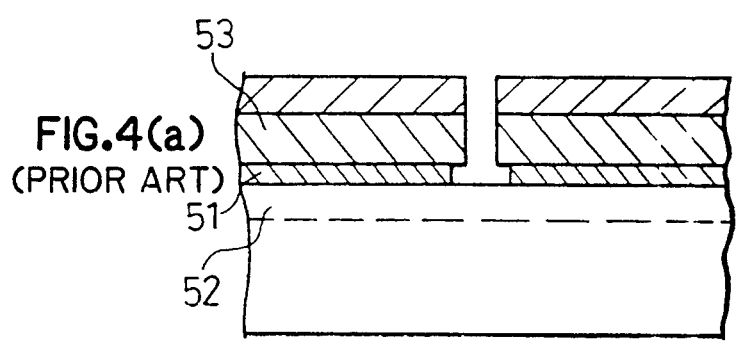
FIGS. 4(a) and 4(b) are diagrams illustrating a production method of a semiconductor device according to the prior art.
Figure 4B:
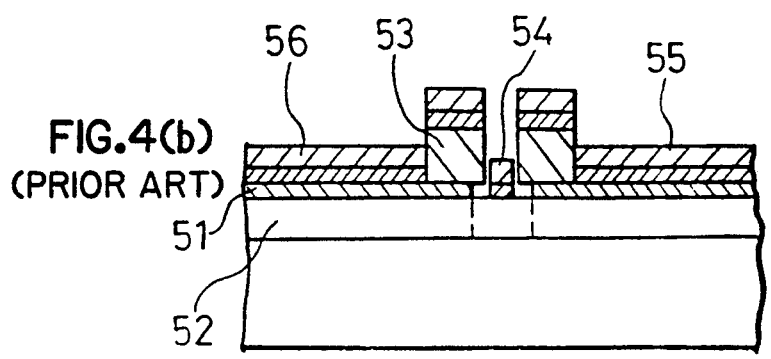

Next, as shown in FIG. 1(h), metal layers 31 comprising Ti/Mo/Au, Ti/Au, or Ti/Pt/Au are deposited on the entire surface, Ti first and, thereafter, as shown in FIG. 1(i), the excess metal is removed by diagonal direction ion milling using Ar gas, utilizing the L-shaped and reversely L-shaped second insulating films 29a and 29b to separate the metal electrode. Thus, the source and drain electrodes 33, 34 and the gate electrode 32 are separated from each other, thereby completing an HEMT as shown in FIG. 1(j).

In the above-described embodiment, a T-shaped gate having a length less then about 0.5 micron width is produced suppressing the gate resistance. Further, the gate electrode and the source and drain electrode are self-aligningly positioned by the L-shaped and reversely L-shaped insulating films, reducing the source series resistance.

Since the $n^+$ type InGaAs layer is provided at the uppermost layer of the device and the source and drain electrodes are non-alloyed ohmic contacts to the $n^+$ type InGaAs layer, the common use of one metal as the source/drain electrode and the gate electrode is realized, thereby simplifying the production process and enhancing the reliability of a device.

By selectively etching the n+ type InGaAs, the source series resistance can be reduced without forming a in n type GaAs, thereby obtaining a device that is superior in the uniformity and reproducibility of the current value and pinch-off voltage.

While in the above-illustrated embodiment a GaAs series HEMT is described, the present invention may be also applied to a GaAs series MESFET. Furthermore, the present invention may be also applied to an InP series HEMT or MESFET.

As is evident from the foregoing description, according to the present invention, since a T-shaped gate is produced utilizing an L-shaped and reversely L-shaped insulating film and a side wall of an insulating film, the gate can be made narrow without an increase in the gate resistance.

The gate electrode and the source and drain electrodes can be self-aligningly positioned a short distance from the L-shaped and reversely L-shaped insulating film. Therefore, the source series resistance can be reduced.

Since an n+ type InGaAs layer is provided at the uppermost upper surface of the device and the source and drain electrodes are in non-alloying ohmic contact, one metal material may be commonly used as the source/drain electrodes and the gate electrode, thereby simplifying the fabrication process and enhancing device reliability.

In addition, by selectively etching the n+ type InGaAs layer, the source series resistance can be reduced without etching a recess in the n type GaAs, thereby obtaining a device superior in the uniformity and reproducibility of the current value and the pinchoff voltage.

What is claimed is:

1. A method of producing a semiconductor device comprising the steps of sequentially:
   depositing on the second layer of a semiconductor structure including a semiconductor substrate, a first semiconductor layer disposed on the substrate, and a second semiconductor layer disposed on the first semiconductor layer, a first insulating film;
   forming an etching mask including an opening on the first insulating film;
   etching a groove in and extending through the first insulating film to the second semiconductor layer;
   depositing a second insulating film having a composition different from the first insulating film on the first insulating film and on the second semiconductor layer in the groove, the second insulating film including side surfaces in the groove;
   depositing a third insulating film different in composition from the second insulating film on the second insulating film;
   etching the third insulating film to leave sidewalls of the third insulating film on the side surfaces of the second insulating film in the groove;
   selectively etching the second insulating film using the sidewalls of the third insulating film as a mask to remove part of the second insulating film from the groove thereby exposing part of the second semiconductor layer and to remove the second insulating film from the first insulating film leaving two portions of the second insulating film on the second semiconductor layer, each portion having a substantially L-shaped cross section;
   selectively etching the second semiconductor layer using the first insulating film, the two portions of the second insulating film, and the sidewalls of the third insulating film as an etching mask thereby exposing the first semiconductor layer between the two portions of the second insulating film; and
   selectively removing the first insulating film and the sidewalls of the third insulating film but not the two portions of the second insulating film.

2. The method of claim 1 comprising:
   after removing the first and third insulating films, depositing at least one metal layer directly on the first semiconductor layer between the two L-shaped portions of the second insulating film and on the second semiconductor layer other than between the two L-shaped portions of the second insulating film; and
   selectively removing the metal layer from the two L-shaped portions of the second insulating film, thereby mutually electrically isolating three parts of the metal layer, the two parts of the metal layer disposed beyond and on opposite sides of the two L-shaped portions of the second insulating film forming a source electrode and a drain electrode, respectively, and the part of the metal layer disposed between the two L-shaped portions of the second insulating film forming a gate electrode.

3. The method of claim 2 wherein the first semiconductor layer is GaAs and the second semiconductor layer is InGaAs including selectively etching the InGaAs layer with boiling concentrated HCl.

4. The method of claim 2 including depositing a plurality of metal layers including titanium and layers selected from the group consisting of Mo/Au, Au, and Pt/Au.

5. The method of claim 1 including depositing silicon oxide as the first insulating film and silicon nitride as the second insulating film.

6. The method of claim 1 including etching the first insulating film to form the groove by reactive ion etching using a mixture of $C_2F_6$, $CHF_3$, $O_2$, and He gases.

7. The method of claim 1 including selectively etching the third insulating film by reactive ion etching using a mixture of $C_2F_6$, $CHF_3$, $O_2$ and He gases.

8. The method of claim 1 including selectively etching the second insulating film by reactive ion etching using a mixture of $CHF_3$ and $O_2$ gases.

9. The method of claim 1 including selectively etching the first and third insulating films by reactive ion etching using a mixture of $C_2F_6$, $CHF_3$, $O_2$, and He gases.

* * * * *